US012622297B2

(12) United States Patent
Kang et al.

(10) Patent No.: US 12,622,297 B2
(45) Date of Patent: May 5, 2026

(54) BONDING STRUCTURE OF SEMICONDUCTOR PACKAGE DEVICE, SEMICONDUCTOR PACKAGE DEVICE, AND METHOD FOR MANUFACTURING THE SAME

(71) Applicant: SAMSUNG ELECTRONICS CO., LTD., Suwon-si (KR)

(72) Inventors: Chang-Kun Kang, Suwon-si (KR); Taehyung Kim, Suwon-si (KR); Mi Hyae Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 380 days.

(21) Appl. No.: 18/228,746

(22) Filed: Aug. 1, 2023

(65) Prior Publication Data

US 2024/0170431 A1 May 23, 2024

(30) Foreign Application Priority Data

Nov. 17, 2022 (KR) .......................... 10-2022-0154815

(51) Int. Cl.
H01L 23/00 (2006.01)
H01L 23/498 (2006.01)

(52) U.S. Cl.
CPC ........ H01L 24/13 (2013.01); H01L 23/49811 (2013.01); H01L 23/49838 (2013.01);
(Continued)

(58) Field of Classification Search
CPC ............... H01L 24/13; H01L 23/49811; H01L 23/49838; H01L 24/11; H01L 24/16;

H01L 2224/11462; H01L 2224/11622; H01L 2224/11903; H01L 2224/13011; H01L 2224/13014; H01L 2224/13023; H01L 2224/16055; H01L 2224/16225; H01L 2924/2064; H01L 2924/3512; H01L 23/49816; H01L 24/81; H01L 21/50;
(Continued)

(56) References Cited

U.S. PATENT DOCUMENTS 6,963,033 B2 * 11/2005 Kim ......................... H01L 24/10
257/737
8,592,959 B2 * 11/2013 Fujii ....................... H01L 23/13
257/664
(Continued)

FOREIGN PATENT DOCUMENTS

EP 0840374 B1 5/2003
JP 2005-353915 A 12/2005
(Continued)

*Primary Examiner* — Douglas W Owens
(74) *Attorney, Agent, or Firm* — Muir Patent Law, PLLC

(57) ABSTRACT

A bonding structure of a semiconductor package device that physically and electrically connects between a semiconductor chip and a package substrate or between a package substrate and a board, the bonding structure includes a solder; a main pad that faces the solder; and an electrically conductive support structure that is connected between the solder and the main pad, the electrically conductive support structure including a sub pad bonded to the solder, the sub pad being spaced apart from the main pad and facing the main pad, and at least one leg extending from the sub pad to the main pad.

20 Claims, 17 Drawing Sheets

(52) U.S. Cl.
CPC .............. *H01L 24/11* (2013.01); *H01L 24/16* (2013.01); *H01L 2224/11462* (2013.01); *H01L 2224/11622* (2013.01); *H01L 2224/11903* (2013.01); *H01L 2224/13011* (2013.01); *H01L 2224/13014* (2013.01); *H01L 2224/13023* (2013.01); *H01L 2224/16055* (2013.01); *H01L 2224/16225* (2013.01); *H01L 2924/2064* (2013.01); *H01L 2924/3512* (2013.01)

(58) Field of Classification Search
CPC ................. H01L 21/56; H01L 23/3107; H01L 2224/1601; H01L 2224/1605; H01L 2224/16052; H01L 2224/81; H01L 24/08; H01L 21/52; H01L 21/565; H01L 24/03; H01L 24/05; H01L 2224/0362; H01L 2224/051; H01L 2224/0801; H01L 2224/08059

See application file for complete search history.

(56) References Cited

U.S. PATENT DOCUMENTS

| | | | |
|---|---|---|---|
| 10,692,829 B2 | 6/2020 | Aoki et al. | |
| 11,284,502 B2 * | 3/2022 | Lau ...................... | H05K 1/0206 |
| 2014/0361442 A1 * | 12/2014 | Lee ...................... | H01L 25/105 |
| | | | 257/777 |
| 2017/0092631 A1 * | 3/2017 | Standing ............. | H01L 25/0753 |

FOREIGN PATENT DOCUMENTS

| | | |
|---|---|---|
| JP | 2006-108422 A | 4/2006 |
| JP | 2012-099642 A | 5/2012 |
| KR | 10-2002-0078095 A | 10/2002 |
| KR | 10-2007-0053555 A | 5/2007 |

* cited by examiner

BONDING STRUCTURE OF SEMICONDUCTOR PACKAGE DEVICE, SEMICONDUCTOR PACKAGE DEVICE, AND METHOD FOR MANUFACTURING THE SAME

CROSS-REFERENCE TO RELATED APPLICATION

This application claims priority to and the benefit of Korean Patent Application No. 10-2022-0154815 filed in the Korean Intellectual Property Office on Nov. 17, 2022, the entire contents of which are incorporated herein by reference.

BACKGROUND

1. Field

Embodiments relate to a bonding structure of a semiconductor package device, a semiconductor package device including the same, and a method for manufacturing the semiconductor package device.

2. Description of the Related Art

In the semiconductor industry, integration density may be increased so that more passive or active devices may be integrated within a given area. Accordingly, a packaging technology of a semiconductor chip that provides a large number of input/output signals within a limited area may be considered.

SUMMARY

The embodiments may be realized by providing a bonding structure of a semiconductor package device that physically and electrically connects between a semiconductor chip and a package substrate or between a package substrate and a board, the bonding structure including a solder; a main pad that faces the solder; and an electrically conductive support structure that is connected between the solder and the main pad, the electrically conductive support structure including a sub pad bonded to the solder, the sub pad being spaced apart from the main pad and facing the main pad, and at least one leg extending from the sub pad to the main pad.

The embodiments may be realized by providing a semiconductor package device including a semiconductor package that includes a package substrate, a semiconductor chip on the package substrate, a first bonding part physically and electrically connecting the package substrate and the semiconductor chip, and an encapsulant encapsulating the semiconductor chip on the package substrate; a board on which the semiconductor package is disposed; and a second bonding part physically and electrically connecting the semiconductor package and the board, wherein the first bonding part or the second bonding part includes a solder; a main pad that faces the solder; and an electrically conductive support structure that is connected between the solder and the main pad and includes a sub pad bonded to the solder, the sub pad being spaced apart from the main pad to face the main pad, and at least one leg extending from an edge of the sub pad to an edge of the main pad and including a curved portion.

The embodiments may be realized by providing a method for manufacturing a semiconductor package device, the method including mounting a semiconductor chip on a package substrate; preparing a semiconductor package by encapsulating the semiconductor chip on the package substrate; and mounting the semiconductor package on a board, wherein mounting the semiconductor chip on the package substrate or mounting the semiconductor package on the board includes forming a main pad on the package substrate or the board; forming a pillar structure on the main pad; forming a pattern structure along circumference of the pillar structure; forming a support structure at an upper surface of the pillar structure and at a space between the pillar structure and the pattern structure; and bonding a solder on the support structure.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, a bonding structure of a semiconductor package device according to an embodiment will be described with reference to the drawings.

Figure 1:
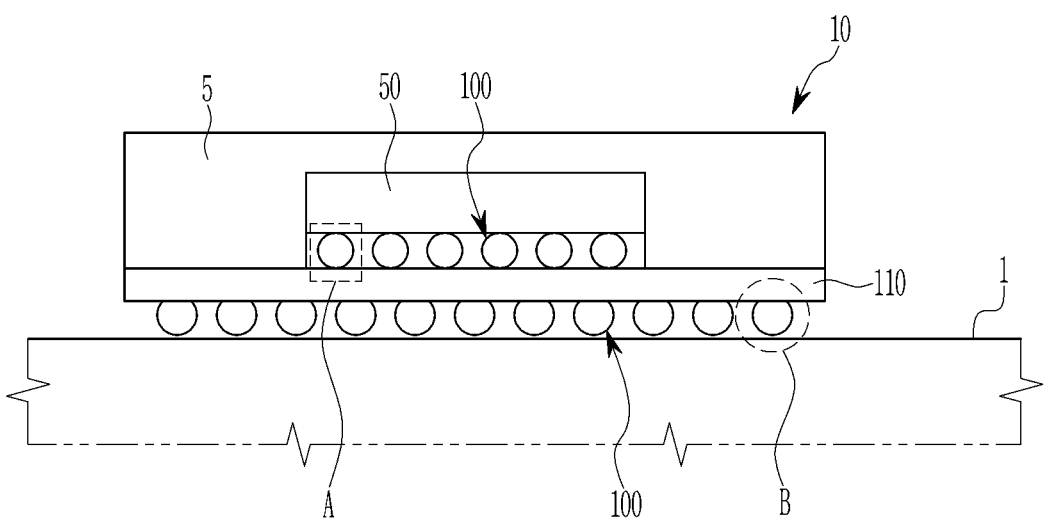
FIG. 1 is a cross-sectional view illustrating a semiconductor package device including a bonding structure according to an embodiment.

FIG. 1 is a cross-sectional view illustrating a semiconductor package device including the bonding structure according to an embodiment. Referring to FIG. 1, the semiconductor package device may include a semiconductor package 10 and a board 1.

In an implementation, the semiconductor package device may further include the bonding structure 100 connecting between the semiconductor package 10 and the board 1. The bonding structure 100 may include a plurality of arrays arranged at a lower surface of the semiconductor package 10. In an implementation, the arrays of the bonding structure 100 may have a regular shape such as a matrix structure or a lattice shape.

The semiconductor package 10 may include a package substrate 110, a semiconductor chip 50, and an encapsulant 5.

The package substrate 110 may be a substrate that connects the semiconductor chip 50 and the board 1, and may facilitate transmission and reception of an electrical signal between the semiconductor chip 50 and the board 1. In an implementation, the package substrate 110 may include a re-distribution layer (RDL), and may include a re-distribution layer manufactured at a wafer level.

The semiconductor chip 50 may be sealed (or encapsulated) on the package substrate 110 by the encapsulant 5. The encapsulant 5 may include a molding compound, a molding underfill, an epoxy, or a resin, and may be, e.g., an epoxy molding compound (EMC). As used herein, the term "or" is not an exclusive term, e.g., "A or B" would include A, B, or A and B.

In an implementation, the semiconductor package 10 may further include the bonding structure 100 connecting the semiconductor chip 50 and the package substrate 110. The bonding structure 100 may include a plurality of arrays arranged at a lower surface (e.g., a surface connected to the package substrate) of the semiconductor chip 50. In an implementation, the arrays of the bonding structure 100 may have a regular shape such as a matrix structure or a lattice shape.

In an implementation, the bonding structure 100 may connect between the semiconductor chip 50 and the package substrate 110 or between the package substrate 110 and the board 1 in the semiconductor packaging device.

The bonding structure 100 may physically and electrically connect between the semiconductor chip 50 and the package substrate 110 or between the package substrate 110 and the board 1. As will be described below, the bonding structure 100 according to the embodiment may attenuate shear stress due to thermal expansion and mechanical deformation by having a support structure 150 (see FIG. 2 and the like). Hereinafter, the bonding structure 100 according to the embodiment will be described in detail with reference to the drawings.

Figure 2:
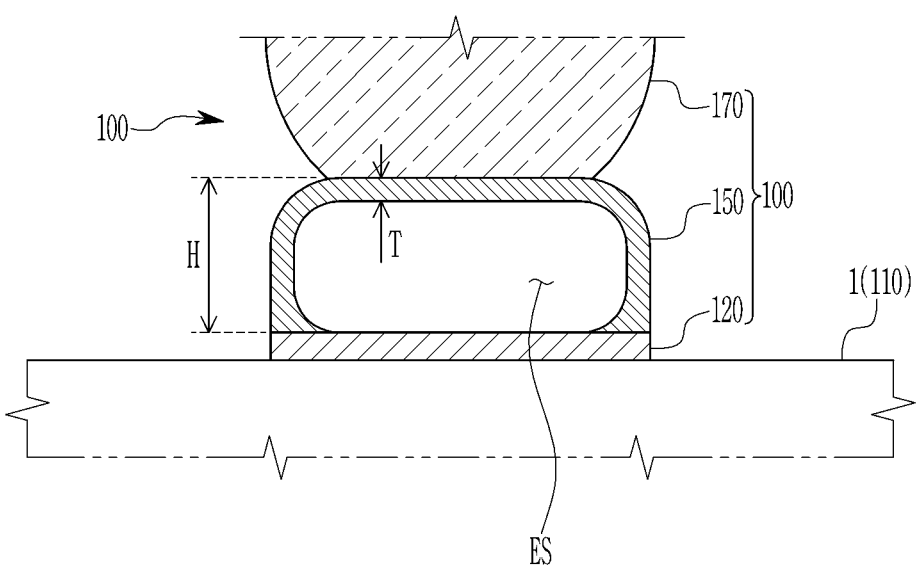
FIG. 2 is an enlarged view of a portion A or a portion B of FIG. 1.
Figure 3:
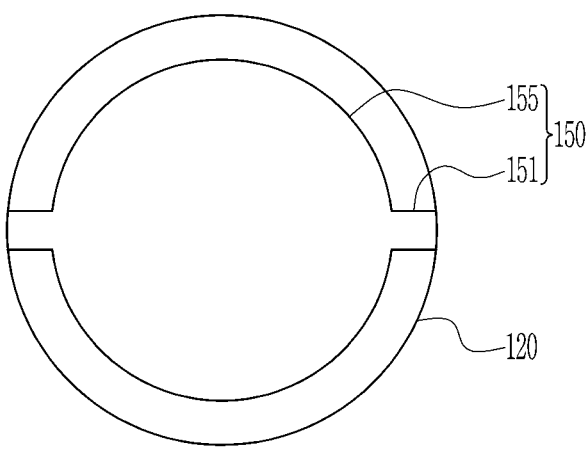
FIG. 3 is a plan view of FIG. 2.
Figure 4:
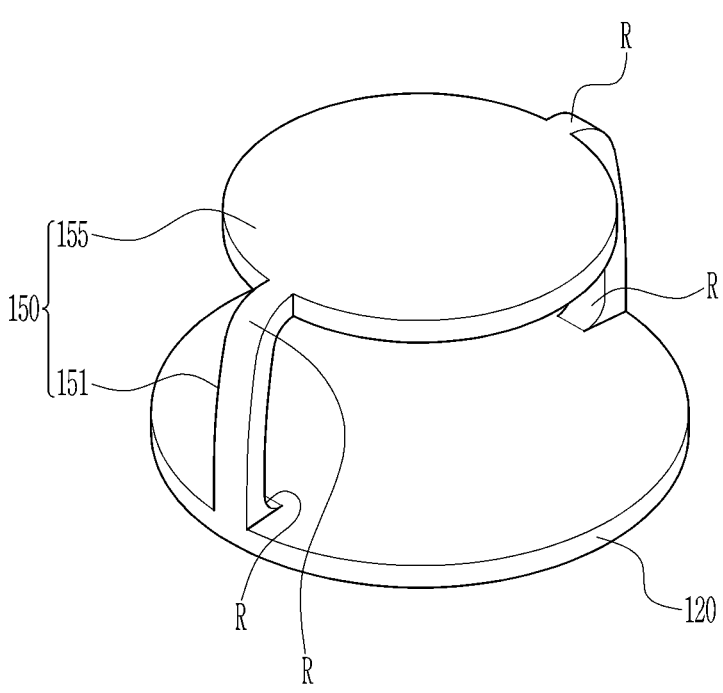
FIG. 4 is a perspective view of FIG. 2.

FIG. 2 is an enlarged view of a portion A (e.g., the bonding structure between the semiconductor chip and the package substrate) or a portion B (e.g., the bonding structure between the semiconductor package and the board) of FIG. 1, FIG. 3 is a plan view of FIG. 2, and FIG. 4 is a perspective view of FIG. 2. In FIGS. 2 to 4, only the remaining components except for some components (e.g., a solder) in the bonding structure 100 are shown for convenience of understanding. The bonding structure 100 according to the embodiment to be described below may be applied between the semiconductor chip 50 and the package substrate 110 as well as between the package substrate 110 and the board 1.

Referring to FIGS. 2 to 4, the bonding structure 100 according to the embodiment may include the solder 170, a main pad 120, and the support structure 150.

The solder 170 may be an alloy including a metal (e.g., tin or the like), and may be a bonding material that transmits an electrical signal. In an implementation, the solder 170 may include a solder bump, a solder pad, a solder ball, or the like, depending on a shape.

The main pad 120 may be on the surface of the board 1 (or the package substrate 110) and may be a portion to which an electrical connector may be connected. In an implementation, the main pad 120 may be a portion to which the support structure 150 and the solder 170 are connected. The main pad 120 may face the solder 170 and may be spaced apart from the solder. In an implementation, the main pad 120 may be electrically connected to electrical wiring included in the board 1 (or the package substrate 110).

The main pad 120 may be exposed to the outside by protruding from a surface of the board 1 (or the package substrate 110). In an implementation, the main pad 120 may be formed on the surface of the board 1 (or the package substrate 110) through a patterning process (e.g., a photolithography process, a plating process, or the like), or may be formed through various suitable methods.

Referring to FIGS. 3 and 4, the main pad 120 may have a flat pad shape, and may have a circular shape on a plane. In an implementation, a planar shape of the main pad 120 may be, e.g., an elliptical shape, a polygonal shape, or the like.

The support structure 150 may be connected between the solder 170 and the main pad 120, and may have electrical conductivity. The support structure 150 may be made of a metal material having electrical conductivity. In an implementation, the support structure 150 may include Cu, Ni, Au, Cr, Al, Ag, Zn, or Fe.

In an implementation, the support structure 150 may help attenuate shear stress transmitted to the solder 170 by a difference in thermal expansion between the semiconductor package 10 and the board 1 (or the semiconductor chip 50 and the package substrate 110) or an impact transmitted to the board 1 (or the package substrate 110).

In an implementation, for structural stability, a height H of the support structure 150 (e.g., a distance from the main pad 120 to the solder 170) may be less than or equal to half of a height of the solder 170. The bonding structure 100 could become structurally unstable if the height H of the support structure 150 were to be greater than half of the height of the solder 170. In an implementation, the height H of the support structure 150 may be, e.g., 10 μm to 200 μm.

Referring to FIGS. 2 to 4, the support structure 150 may include a sub pad 155 and at least one leg 151.

The sub pad 155 may face the main pad 120, and may be spaced apart from the main pad. In an implementation, the sub pad 155 may be arranged parallel to the main pad 120. In an implementation, the sub pad 155 may be positioned above the main pad 120 while being spaced apart from the main pad 120 by a predetermined distance.

The sub pad 155 may be bonded to the solder 170. In an implementation, as illustrated in FIGS. 3 and 4, the sub pad 155 may have a flat pad shape, and may have a circular shape on a plane. In an implementation, a planar shape of the sub pad 155 may be, e.g., an elliptical shape, a polygonal shape, or the like.

The sub pad 155 may have the same size as that of the main pad 120 on a plane or have a smaller size than the main pad 120 on a plane. In an implementation, the sub pad 155 may have a diameter of, e.g., 10 μm to 500 μm on a plane. In an implementation, the sub pad 155 may have a similar thickness to that of the main pad 120. In an implementation, a thickness T of the sub pad 155 may be, e.g., 5 μm to 50 μm.

The at least one leg 151 may be a portion connected between the sub pad 155 and the main pad 120, and may have a shape of a metal thin film. The at least one leg 151 may be deformed within a predetermined range or may have elasticity so that stress transmitted from the main pad 120 to the sub pad 155 may be attenuated (or reduced).

The at least one leg 151 may extend from the sub pad 155 to the main pad 120. In an implementation, the at least one leg 151 may connect an edge of the sub pad 155 and an edge of the main pad 120. In an implementation, the sub pad 155 may be supported by the at least one leg 151 on the main pad 120.

In an implementation, the at least one leg 151 may be integrally formed with the sub pad 155. In an implementation, the at least one leg 151 and the sub pad 155 may be made of the same material, and may be simultaneously formed in one process (e.g., as a one-piece, monolithic structure).

In an implementation, each leg 151 may include a curved portion R. In an implementation, the leg 151 may have the curved portion R at a portion connected to the sub pad 155. In an implementation, the leg 151 may extend horizontally (e.g., outwardly) from the edge of the sub pad 155, may have a shape that is bent downwardly toward the main pad 120, and may have the curved portion R at the bent portion. In an implementation, the leg 151 may have the curved portion R at a portion connected to the main pad 120. In an implementation, the leg 151 may have a shape bent inwardly of the main pad 120 while being connected to the main pad 120, and may have the curved portion R at the bent portion.

The at least one leg 151 may have the same thickness as that of the aforementioned sub pad 155. As will be described below, the sub pad 155 and the leg 151 may be formed together through the same process (e.g., a plating process). In an implementation, each leg 151 may have a thickness of 5 μm to 50 μm.

In an implementation, as illustrated in FIGS. 3 and 4, the support structure 150 may include two legs 151. The two legs 151 may be symmetrically disposed or arranged with respect to an axis passing through centers of the sub pad 155 and the main pad 120. Accordingly, the support structure 150 may have structural stability.

In an implementation, positions of the two legs 151 may have directionality. In an implementation, the two legs 151 may be disposed in a direction capable of attenuating stress transmitted to the solder 170. In an implementation, the two legs 151 may be disposed in a direction toward a center of the board 1 (or the package substrate 110) on a plane. In an implementation, a straight line passing through the two legs 151 in FIG. 3 (e.g., in a lengthwise direction of the legs 151) may pass through the center of the board 1 (or the package substrate 110).

Each of the two legs 151 may have a width smaller than half of a circumference of the sub pad 155. In an implementation, the two legs 151 may be spaced apart from each other along circumference (or perimeter) of the sub pad 155.

In an implementation, the support structure 150 may be deformed into various shapes depending on the number and shape of the legs 151.

Figure 5:
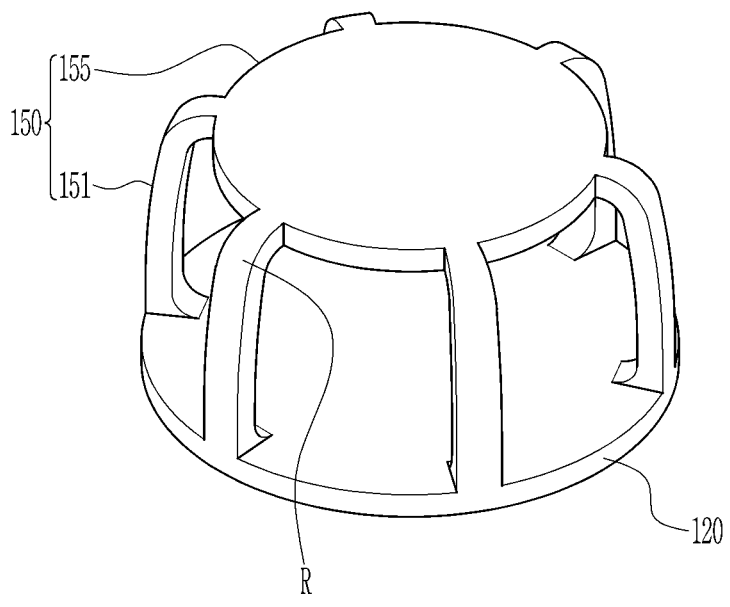
FIGS. 5 to 7 are views of other embodiments of the bonding structure.
Figure 6:
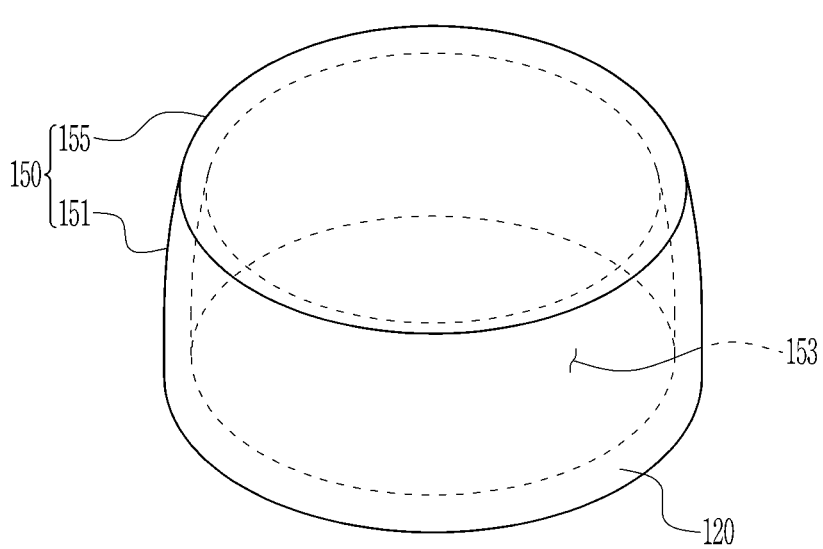
Figure 7:
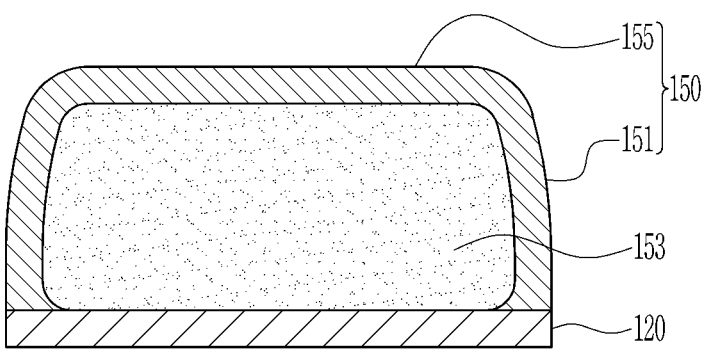

FIGS. 5 to 7 are views illustrating other embodiments of the bonding structure. FIGS. 5 and 6 are perspective views of other embodiments of the bonding structure 100, and FIG. 7 is a cross-sectional view of FIG. 6. In addition, for convenience of understanding, FIGS. 5 to 7 illustrate the bonding structure except for the solder 170 as shown in FIG. 4.

Referring to FIG. 5, the support structure 150 according to an embodiment may include three or more legs 151 (e.g., six legs 151). In an implementation, the support structure 150 may include a number of legs 151 constituting a plurality of pairs. The legs forming a pair may be symmetrically disposed with respect to an axis passing through centers of the sub pad 155 and the main pad 120. In an implementation, structural stability of the support structure 150 may be further increased.

A sum of widths of the three or more legs 151 may be smaller than a circumference of the sub pad 155. In an implementation, the three or more legs 151 may be spaced apart from each other along circumference of the sub pad 155.

In an implementation, an inner space ES (see FIG. 2) surrounded by the sub pad 155, the main pad 120, and the three or more legs 151 may be defined thereby. In an implementation, the aforementioned inner space may have a cylindrical or disc shape with a corner chamfered into a curved surface.

Referring to FIGS. 6 and 7, the support structure 150 according to an embodiment may include one leg 151. In an implementation, the support structure 150 may include the one leg 151 (e.g., continuously) connecting edges of the sub pad 155 and the main pad 120. The one leg may have a cylindrical shape (e.g., continuously) surrounding an edge of the sub pad 155 and an edge of the main pad 120 together.

Referring to FIG. 7, a polymer layer 153 may be further included between the sub pad 155 and the main pad 120. In an implementation, the inner space (ES) surrounded by the sub pad 155, the main pad 120, and the one leg 151 may be filled with the polymer layer 153.

In an implementation, the polymer layer 153 generated in a manufacturing process of the support structure 150 may not be removed, and a process may be simplified and a process time may be reduced.

Hereinafter, a method for manufacturing the semiconductor package device according to an embodiment will be described. In particular, a method for manufacturing the bonding structure 100 will be mainly described.

Referring to FIG. 1, the semiconductor package device may include the semiconductor package 10 by mounting the semiconductor chip 50 on the package substrate 110 and encapsulating the semiconductor chip 50 on the package substrate 110 through the encapsulant 5. After that, the semiconductor package 10 may be mounted on the board 1.

The bonding structure 100 according to the above-described embodiment may be applied to at least one of a step of mounting the semiconductor chip 50 on the package substrate 110 and a step of mounting the semiconductor package 10 on the board 1 during this process. In an implementation, when the semiconductor chip 50 is mounted on the package substrate 110 or when the semiconductor package 10 is mounted on the board 1, the bonding structure according to the embodiment may be applied. In an implementation, the bonding structure 100 according to the above-described embodiment may be applied to both steps that include the step of mounting the semiconductor chip 50 on the package substrate 110 and the step of mounting the semiconductor package 10 on the board 1.

Figure 11:
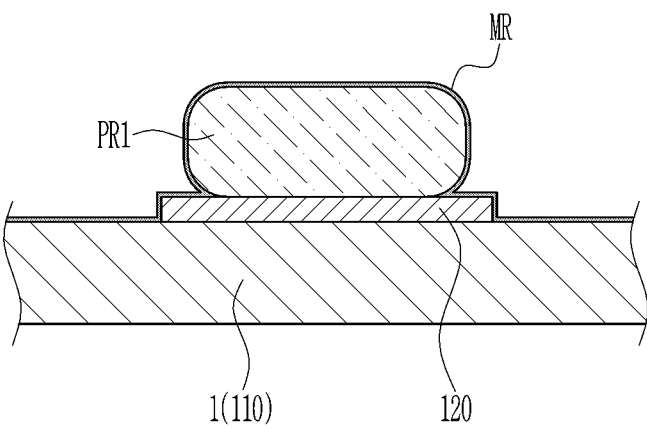
Figure 12:
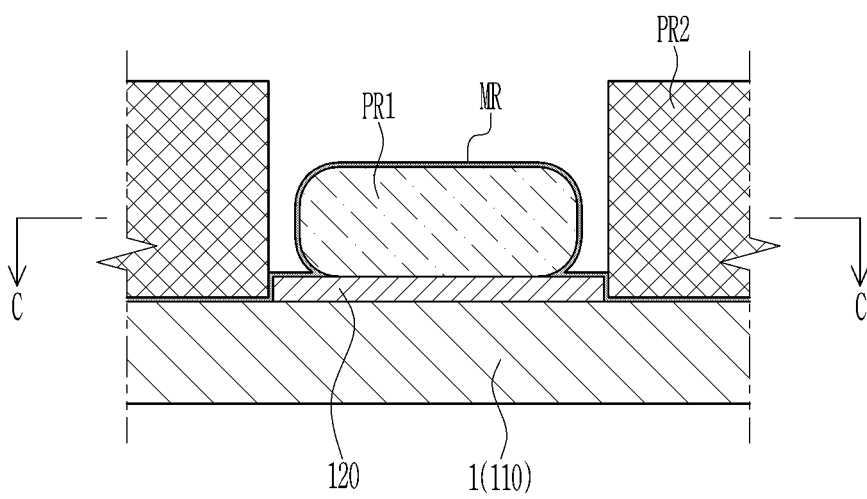
Figure 13:
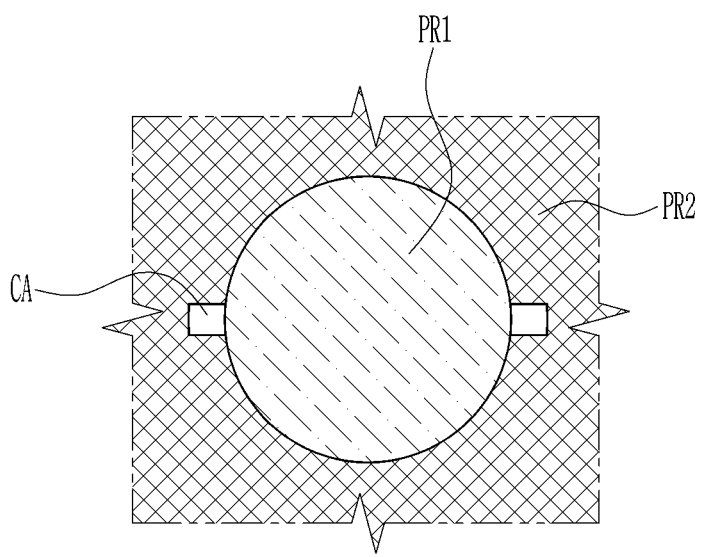
Figure 14:
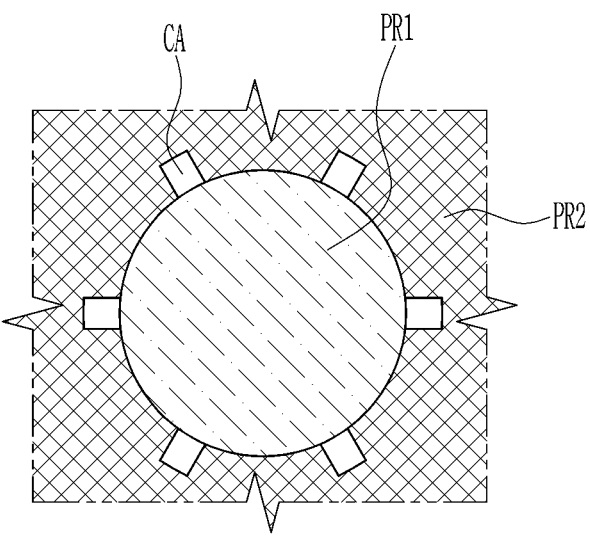
Figure 15:
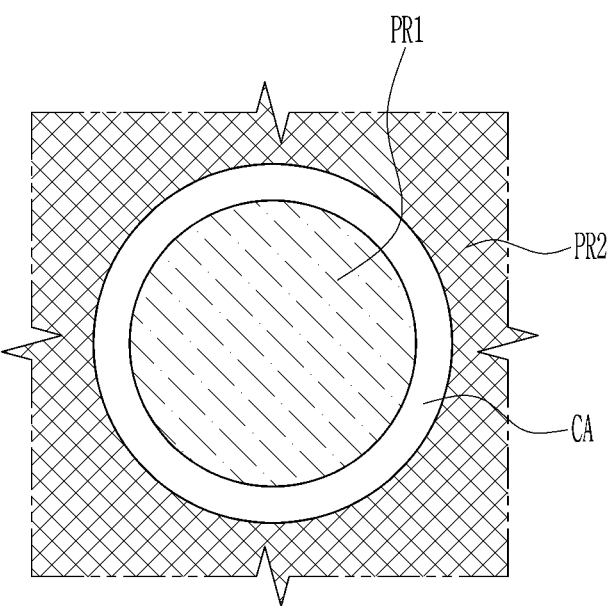

FIGS. 8 to 17 are views of stages in a method for manufacturing the bonding structure according to an embodiment. FIGS. 8 to 17 are cross-sectional views, FIGS. 8 to 12, 16, and 17 are cross-sectional views cut in a vertical direction, and FIGS. 13 to 15 are cross-sectional views cut in a horizontal direction.

In an implementation, as illustrated in FIGS. 8 to 17, a manufacturing process may be of one bonding structure. In an implementation, a plurality of bonding structures may be simultaneously manufactured through the method shown in FIGS. 8 to 17, and e.g., the bonding structure between the semiconductor chip 50 and the package substrate 110 may include a wafer level.

Figure 8:
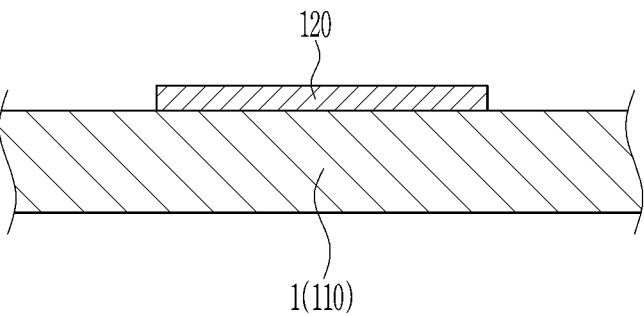
FIGS. 8 to 17 are views of stages in a method for manufacturing the bonding structure according to an embodiment.

FIG. 8 illustrates a step of forming the main pad 120 on the package substrate 110 (or the board 1). Hereinafter, the package substrate 110 (or the board 1) is collectively referred to as a substrate.

Referring to FIG. 8, the main pad 120 may be formed on a surface of the substrate so that the main pad is electrically connected to electrical wiring included in the substrate. The main pad 120 may protrude from the surface of the substrate so that the main pad is exposed to the outside. The main pad 120 may be formed on the surface of the substrate through the patterning process. In an implementation, a metal thin film including a metal material such as copper (Cu) or the like may be stacked on the substrate, the stacked metal thin film may be coated with a photoresist material, and then the main pad 120 may be formed through a photolithography process in which the coated material is exposed, developed, and etched. In an implementation, the main pad may be formed through various suitable methods. In an implementation, an additional plating process may be performed to form the main pad 120.

In an implementation, the main pad 120 may have a flat pad shape and may be formed in a circular shape on a plane.

In an implementation, according to a pattern patterned through the photolithography process, the main pad 120 may have various shapes such as an elliptical shape, a polygonal shape, or the like.

Figure 9:
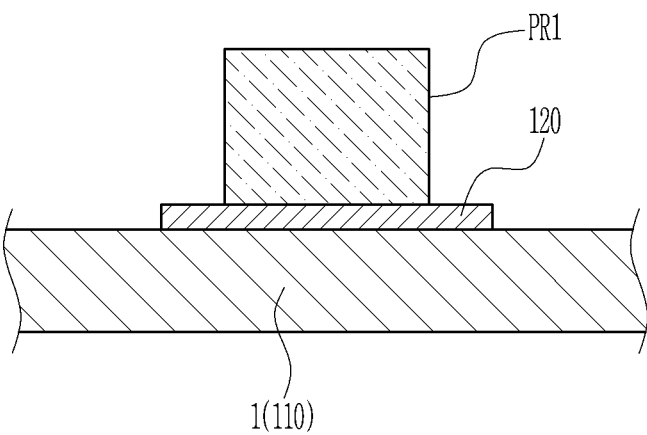
Figure 10:
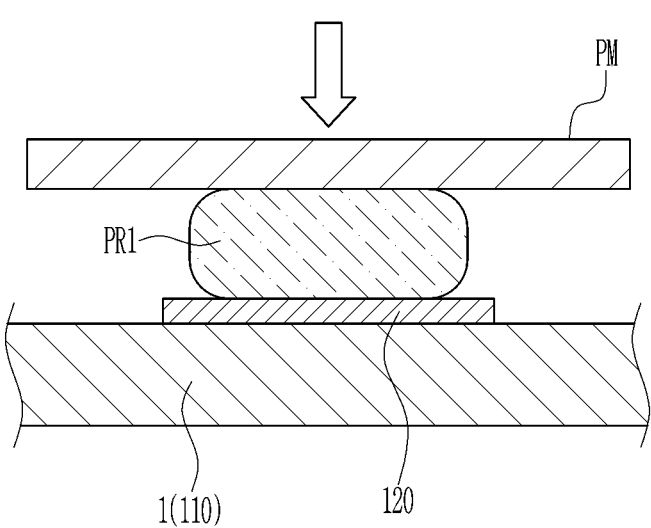

FIGS. 9 and 10 illustrate a step of forming a pillar structure on the main pad 120. In an implementation, the pillar structure may be formed on the main pad 120 through a photoresist process and a press process.

Referring to FIG. 9, a first photoresist PR1 may be deposited on a surface of the main pad 120. Thereafter, the first photoresist PR1 may be patterned in a pillar shape on a central portion of the main pad 120 through a photolithography process (e.g., an exposure process, a development process, and an etching process using a mask). The first photoresist PR1 may have a cylindrical shape, and may have a smaller diameter than that of the main pad 120. The first photoresist PR1 may include a liquid photoresist or a dry film.

Referring to FIG. 10, the first photoresist PR1 having a pillar shape may be deformed by pressing the first photoresist PR1 in a height direction (e.g., from top to bottom). In an implementation, a curved surface may be formed at at least a portion of a side surface of the first photoresist PR 1.

In an implementation, an upper surface of the first photoresist PR1 with the pillar shape may be downwardly pressed by a presser (e.g., a press device) PM. In an implementation, as a height of the first photoresist PR1 with the pillar shape decreases, a side surface of the first photoresist may be deformed (e.g., outwardly) to be convex. In an implementation, through a pressing process, the first photoresist PR1 with the pillar shape may have a curved surface on at least a portion of the side surface thereof. In an implementation, curved surfaces may be formed at portions adjacent to upper and lower corners of the first photoresist PR1.

FIG. 11 illustrates a step of forming a metal seed layer MR.

Referring to FIG. 11, after forming the above-described pillar structure, the metal seed layer MR may be formed on an exposed upper surface of the main pad 120 and on a surface of the pillar structure (e.g., the first photoresist PR1). This is to form the support structure 150 through a subsequent plating process by depositing a plating seed layer on a surface where the support structure 150 is to be formed.

The metal seed layer MR may be deposited using physical vapor deposition (PVD) or chemical vapor deposition (CVD). In an implementation, the metal seed layer MR may be deposited on an entire exposed surface of the main pad 120 and the first photoresist PR1.

FIG. 12 illustrates a step of forming a pattern structure along circumference of the pillar structure. In an implementation, the pattern structure (e.g., a second photoresist PR2) may be formed along circumference of the pillar structure (e.g., the first photoresist PR1) through a photolithography process.

Referring to FIG. 12, the second photoresist PR2 may be deposited along circumference of the pillar structure (e.g., the first photoresist PR1). In this case, patterning may be performed to have at least one separation space between the first photoresist PR1 and the second photoresist PR2.

In an implementation, the second photoresist PR2 may be deposited and patterned through a photolithography process. In an implementation, the second photoresist PR2 may be patterned along a circumference of the first photoresist PR1 through an exposure process, a development process, and an etching process using a mask.

The second photoresist PR2 may be formed to a higher height than that of the first photoresist PR1 (e.g., the first photoresist PR1 being in a compressed and deformed state). In an implementation, the second photoresist PR2 may be formed to a height that is the same as that of the first photoresist PR1 before the first photoresist PR1 was pressed. The second photoresist PR2 may include a liquid photoresist or a dry film.

The second photoresist PR2 may have a shape surrounding the first photoresist PR1 having a cylindrical shape. In an implementation, the second photoresist PR2 may be patterned to have at least one separation space CA (see FIGS. 13 to 15) between the first photoresist PR1 and the second photoresist PR2.

The separation space CA may be a space where the leg 151 is to be formed, and the number and shape of the separation spaces CA may be variously formed according to a pattern of the second photoresist PR2. The separation space CA may extend from an upper end to a lower end of the first photoresist PR1. The separation space CA may have a thickness of 5 μm to 50 μm on a plane.

FIGS. 13 to 15 are views illustrating the second photoresist PR2 patterned in various shapes. FIGS. 13 to 15 are cross-sectional views in a C-C direction of FIG. 12.

Referring to FIG. 13, two separation spaces CA may be formed between the first photoresist PR1 and the second photoresist PR2. In an implementation, as shown in FIG. 4, the support structure 150 including the two legs 151 may be formed. The two separation spaces CA may be symmetrically disposed with respect to an axis passing through a center of the first photoresist PR1.

Referring to FIG. 14, three or more separation spaces CA may be formed between the first photoresist PR1 and the second photoresist PR2. In an implementation, as shown in FIG. 5, the support structure 150 including three legs 151 may be formed. In an implementation, the separation space CA may be formed with the number constituting a plurality of pairs. The separation spaces CA forming a pair may be symmetrically disposed with respect to an axis passing through a center of the first photoresist PR1.

Referring to FIG. 15, one continuous separation space CA may be formed between the first photoresist PR1 and the second photoresist PR2 (e.g., around an outer side of the first photoresist PR1). In an implementation, a ring-shaped separation space CA may be formed on a plane. In an implementation, as shown in FIG. 6, the support structure 150 including one continuous leg 151 may be formed. In an implementation, the separation space CA may have a (e.g., hollow) cylindrical shape.

By forming the one continuous separation space CA between the first photoresist PR1 and the second photoresist PR2 as shown in FIG. 15, as shown in FIG. 6, the support structure 150 including a cylindrical leg 151 connecting an edge of the sub pad 155 and an edge of the main pad 120 may be formed. In an implementation, the first photoresist PR1 existing in a space surrounded by the sub pad 155, the main pad 120, and the leg 151 may not be removed. Accordingly, the bonding structure according to the present embodiment may include the first photoresist PR1 (e.g., the polymer layer 153) between the sub pad 155 and the main pad 120.

Figure 16:
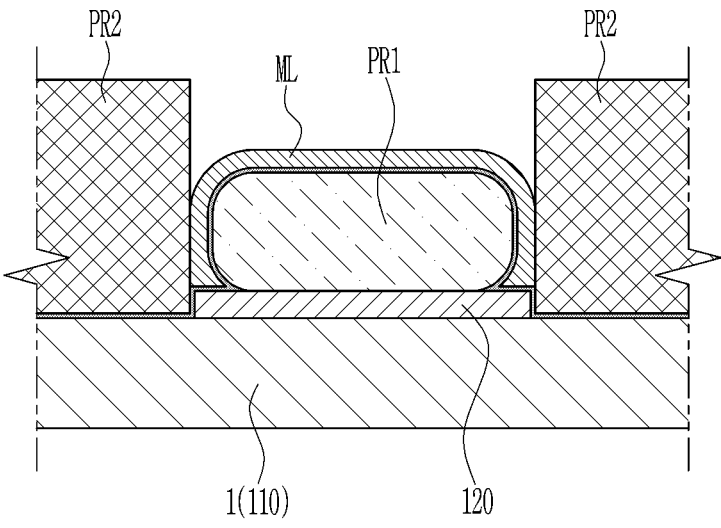

After forming the pattern structure (e.g., the second photoresist PR2) including the above-described separation space CA, the support structure 150 may be formed. FIG. 16 illustrates a step of forming the support structure 150.

Referring to FIG. 16, the support structure may be formed at an upper surface of the pillar structure (e.g., a first photoresist PR1) and at a space between the pillar structure and the pattern structure (e.g., the second photoresist PR2).

In an implementation, the support structure 150 may include the sub pad 155 at an upper surface of the first photoresist PR1 and at least one leg 151 at a space between the first photoresist PR1 and the second photoresist PR2.

In an implementation, the support structure 150 may be formed by forming a plating layer ML to surround the pillar structure (e.g., the first photoresist PR1) on the main pad 120 through electroplating. The plating layer ML may include an electrically conductive material. In an implementation, the plating layer ML may include, e.g., Cu, Ni, Au, Cr, Al, Ag, Zn, or Fe. The plating layer ML may have a thickness of 5 μm to 50 μm.

The plating layer ML may be formed as or may form the support structure 150. The plating layer ML on the upper surface of the first photoresist PR1 may be the sub pad 155 of the support structure 150 and the plating layer ML that fills a space between the first photoresist PR1 and the second photoresist PR2 may be the at least one leg 151 of the support structure 150.

Figure 17:
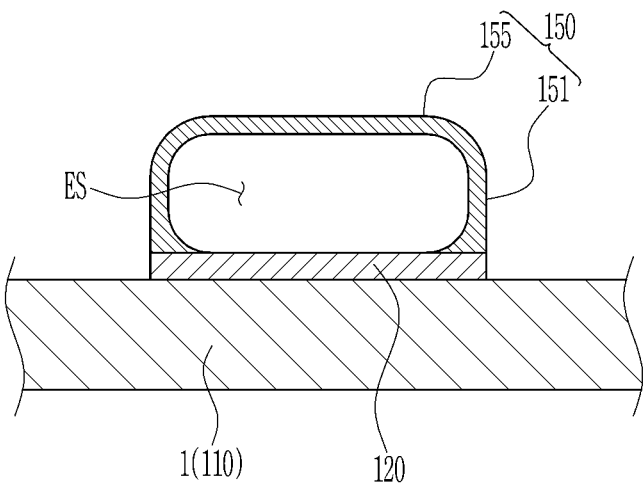

FIG. 17 illustrates a step of stripping (or removing) the first photoresist PR1, the second photoresist PR2, and the metal seed layer MR. Referring to FIG. 17, the plating layer ML may be formed as the support structure 150 by stripping the first photoresist PR1, the second photoresist PR2, and the metal seed layer MR.

Referring to FIG. 17, the support structure 150 may include the sub pad 155 and the at least one leg 151. In an implementation, the first photoresist PR1 may be stripped, and an inner space ES surrounded by the sub pad 155, the main pad 120, and the at least one leg 151 may be defined between the support structure 150 and the main pad 120.

In an implementation, the first photoresist PR1 may be surrounded by the main pad 120 and the support structure 150 and may not be removed in a case of the support structure 150 including the one continuous leg 151 as shown in FIGS. 6, 7, and 15, and the first photoresist PR1 remains. In an implementation, the first photoresist PR1 (e.g., the polymer layer 153) may be included between the main pad 120 and the support structure 150.

After the support structure 150 is formed through the above process, the solder 170 may be bonded on the support structure 150. The solder 170 may be formed on a lower surface (or a bonding surface between the substrate and the solder) of the semiconductor chip 50 or the semiconductor package 10. In an implementation, after the solder 170 of the semiconductor chip 50 or the semiconductor package 10 is positioned on the sub pad 155 of the support structure 150 formed on the main pad 120 of the substrate, the solder 170 may be bonded on the sub pad 155 through a reflow process of melting the solder 170.

By way of summation and review, in order to physically and electrically connect a semiconductor chip and a package substrate, a solder bump may be formed on a bonding pad to shorten an electrical transmission path and increase a density of an input/output (I/O).

In addition, for physical and electrical connection between a semiconductor package and a motherboard (hereinafter referred to as a board) that is an external circuit board, a ball grid array (BGA) or land grid array (LGA) method using a solder ball or a solder pad as an input/output of the semiconductor package may be used. Accordingly, it is possible to increase mounting density and improve electrical characteristic while reducing a mounting area.

On the other hand, in a case of the above-described solder joint method, a solder may be damaged due to a temperature change, a physical external impact, or the like. For example, thermal stress due to a difference in thermal expansion between the chip and the substrate (or the package and the board) when a temperature changes or the physical external impact such as bending of the substrate (or the board) could cause a crack in the solder or may cause fatigue failure in the solder.

One or more embodiments may provide a bonding structure capable of attenuating shear stress to thermal expansion and deformation in a semiconductor package device.

One or more embodiments may provide a semiconductor package device including the bonding structure and a method for manufacturing the semiconductor package device capable of attenuating shear stress due to thermal expansion and deformation.

According to an embodiment, shear stress due to thermal expansion and mechanical deformation may be attenuated by applying a bonding structure including a support structure having a plurality of legs to at least one of between a semiconductor chip and a package substrate and between the package substrate and a board.

In addition, a reliability of a semiconductor product may be improved by suppressing a crack and fatigue crack (or fatigue failure) caused by expansion, contraction, impact, vibration, or the like.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A bonding structure of a semiconductor package device that physically and electrically connects between a semiconductor chip and a package substrate or between a package substrate and a board, the bonding structure comprising:
   a solder;
   a main pad that faces the solder; and
   an electrically conductive support structure that is connected between the solder and the main pad, the electrically conductive support structure including:
      a sub pad bonded to the solder, the sub pad being spaced apart from the main pad and facing the main pad, and
      at least one leg extending from the sub pad to the main pad.

2. The bonding structure as claimed in claim 1, wherein the sub pad is arranged parallel to the main pad.

3. The bonding structure as claimed in claim 1, wherein the at least one leg connects an edge of the sub pad and an edge of the main pad.

4. The bonding structure as claimed in claim 1, wherein the at least one leg includes a curved portion.

5. The bonding structure as claimed in claim 1, wherein:
   the electrically conductive support structure includes two legs, and
   the two legs are symmetrically disposed with respect to an axis passing through centers of the sub pad and the main pad.

6. The bonding structure as claimed in claim 1, wherein:

the electrically conductive support structure includes three or more legs, and an inner space is defined by the sub pad, the main pad, and the three or more legs.

7. The bonding structure as claimed in claim 1, further comprising a polymer layer between the sub pad and the main pad, wherein the at least one leg surrounds the polymer layer.

8. The bonding structure as claimed in claim 1, wherein a height of the electrically conductive support structure is half or less of a height of the solder.

9. The bonding structure as claimed in claim 1, wherein the electrically conductive support structure includes Cu, Ni, Au, Cr, Al, Ag, Zn, or Fe.

10. A semiconductor package device, comprising:

a semiconductor package that includes:

a package substrate, a semiconductor chip on the package substrate, a first bonding part physically and electrically connecting the package substrate and the semiconductor chip, and an encapsulant encapsulating the semiconductor chip on the package substrate;

a board on which the semiconductor package is disposed; and a second bonding part physically and electrically connecting the semiconductor package and the board, wherein the first bonding part or the second bonding part includes:

a solder;

a main pad that faces the solder; and an electrically conductive support structure that is connected between the solder and the main pad and includes:

a sub pad bonded to the solder, the sub pad being spaced apart from the main pad to face the main pad, and at least one leg extending from an edge of the sub pad to an edge of the main pad and including a curved portion.

11. The semiconductor package device as claimed in claim 10, wherein a height of the electrically conductive support structure is 10 μm to 200 μm.

12. The semiconductor package device as claimed in claim 10, wherein a thickness of each of the sub pad and the at least one leg is 5 μm to 50 μm.

13. A method for manufacturing a semiconductor package device, the method comprising:

mounting a semiconductor chip on a package substrate;

preparing a semiconductor package by encapsulating the semiconductor chip on the package substrate; and mounting the semiconductor package on a board, wherein mounting the semiconductor chip on the package substrate or mounting the semiconductor package on the board includes:

forming a main pad on the package substrate or the board;

forming a pillar structure on the main pad;

forming a pattern structure along circumference of the pillar structure;

forming a support structure at an upper surface of the pillar structure and at a space between the pillar structure and the pattern structure; and bonding a solder on the support structure.

14. The method as claimed in claim 13, wherein forming the pillar structure includes:

depositing a first photoresist on the main pad;

patterning the first photoresist in a pillar shape on a center portion of the main pad; and deforming the first photoresist having the pillar shape by pressing the first photoresist having the pillar shape from top to bottom.

15. The method as claimed in claim 14, wherein deforming the first photoresist includes forming a curved surface on at least a portion of a side surface of the first photoresist.

16. The method as claimed in claim 13, wherein forming the pattern structure includes:

depositing a second photoresist along the circumference of the pillar structure; and patterning the second photoresist to have at least one separation space between the second photoresist and the pillar structure.

17. The method as claimed in claim 16, wherein the at least one separation space extends from an upper end of the pillar structure to a lower end of the pillar structure.

18. The method as claimed in claim 13, wherein:

the support structure includes a sub pad on the upper surface of the pillar structure and at least one leg in the space between the pattern structure and the pillar structure, and the support structure is formed of an electrically conductive material.

19. The method as claimed in claim 13, wherein forming the support structure includes forming a plating layer to surround the pillar structure on the main pad through electroplating.

20. The method as claimed in claim 19, further comprising forming a metal seed layer on an exposed upper surface of the main pad and a surface of the pillar structure after forming the pillar structure.

* * * * *